United States Patent
Simonetti et al.

(10) Patent No.: US 9,575,154 B2
(45) Date of Patent: *Feb. 21, 2017

(54) MR IMAGING USING A MULTI-POINT DIXON TECHNIQUE

(75) Inventors: Arjan Willem Simonetti, Best (NL); Henri Gwenael Herigault, Geldrop (NL)

(73) Assignee: KONINKLIJKE PHILIPS ELECTRONICS N.V., Eindhoven (NL)

(*) Notice: Subject to any disclaimer, the term of this patent is extended or adjusted under 35 U.S.C. 154(b) by 788 days.

This patent is subject to a terminal disclaimer.

(21) Appl. No.: 13/990,089

(22) PCT Filed: Nov. 28, 2011

(86) PCT No.: PCT/IB2011/055336
§ 371 (c)(1),
(2), (4) Date: May 29, 2013

(87) PCT Pub. No.: WO2012/073181
PCT Pub. Date: Jun. 7, 2012

(65) Prior Publication Data
US 2013/0249554 A1    Sep. 26, 2013

(30) Foreign Application Priority Data

Dec. 2, 2010 (EP) .................................... 10193467
Mar. 24, 2011 (EP) .................................... 11159548

(51) Int. Cl.
*G01R 33/58* (2006.01)
*G01R 33/48* (2006.01)
(Continued)

(52) U.S. Cl.
CPC ......... *G01R 33/583* (2013.01); *G01R 33/4828* (2013.01); *G01R 33/56527* (2013.01); *G01R 33/5607* (2013.01)

(58) Field of Classification Search
USPC ... 324/300–322; 600/407–435; 382/128–131
See application file for complete search history.

(56) References Cited

U.S. PATENT DOCUMENTS 4,931,733 A    6/1990 Hanawa
5,099,207 A    3/1992 Luyten
(Continued)

OTHER PUBLICATIONS

Glover, Gary H. "Multipoint Dixon Technique for Water and Fat Proton and Susceptibility Imaging", Journal of Magnetic Resonance Imaging, Society for Magnetic Resonance Imaging, vol. 1, Jan. 1991, pp. 521-530.

(Continued)

*Primary Examiner* — Melissa Koval
*Assistant Examiner* — Tiffany Fetzner

(57) ABSTRACT

At least a portion of a body (10) of a patient is positioned in an examination volume of a MR device (1). The portion of the body (10) is subject to a calibration sequence including RF pulses and switched magnetic field gradients controlled in such a manner that a calibration signal data set is acquired by a multi-point Dixon technique at a first image resolution. Calibration parameters are derived from the calibration signal data set. The portion of the body (10) is subject to an imaging sequence including RF pulses and switched magnetic field gradients controlled in such a manner that a diagnostic signal data set is acquired at a second image resolution which is higher than the first image resolution A diagnostic MR image is reconstructed from the diagnostic signal data set. The MR device (1) is operated according to the derived calibration parameters with fat saturation during acquisition of the diagnostic signal data set and/or during reconstruction of the diagnostic MR image.

16 Claims, 2 Drawing Sheets

(51) Int. Cl.
*G01R 33/565* (2006.01)
*G01R 33/56* (2006.01)

(56) References Cited

U.S. PATENT DOCUMENTS

| | | | |
|---|---|---|---|
| 5,309,102 A | 5/1994 | Deckard | |
| 5,617,028 A | 4/1997 | Meyer | |
| 6,064,208 A | 5/2000 | Steckner | |
| 6,466,014 B1 | 10/2002 | Ma | |
| 6,509,735 B2 | 1/2003 | Mueller | |
| 6,529,002 B1 | 3/2003 | Kim | |
| 6,995,559 B2 | 2/2006 | Agilandam | |
| 7,099,499 B2 | 8/2006 | Blezek | |
| 7,116,106 B1 | 10/2006 | Wolf | |
| 7,199,585 B2 | 4/2007 | Kruiskamp | |
| 7,233,143 B2 | 6/2007 | Moriguchi | |
| 7,664,541 B2 | 2/2010 | Wang | |
| 8,138,759 B2* | 3/2012 | Greiser | G01R 33/3875 324/309 |
| 2005/0165295 A1 | 7/2005 | Li | |
| 2005/0264288 A1 | 12/2005 | Campagna | |
| 2006/0164082 A1 | 7/2006 | Foxall | |
| 2008/0258725 A1 | 10/2008 | Hetherington | |
| 2010/0052674 A1 | 3/2010 | Jellus | |
| 2010/0127702 A1* | 5/2010 | Greiser | G01R 33/3875 324/309 |
| 2010/0189328 A1 | 7/2010 | Boernert | |
| 2012/0092014 A1* | 4/2012 | Castillo | G01R 33/3875 324/318 |
| 2012/0249137 A1* | 10/2012 | Witschey | G01R 33/3875 324/309 |
| 2013/0249553 A1* | 9/2013 | Simonetti | G01R 33/4828 324/309 |
| 2013/0249554 A1* | 9/2013 | Simonetti | G01R 33/4828 324/309 |
| 2016/0124064 A1* | 5/2016 | de Weerdt | G01R 33/4828 324/309 |

OTHER PUBLICATIONS

McKenzie, C.A. et al "Abdominal Three Point Imaging with Self Calibrating Parallel MRI", International Society for Magnetic Resonance in Medicine. vol. 11, May 2004, p. 917.

Kellman, P. et al "Improved Cardiac Shim using Field Map Estimate from Multi-Echo Dixon Method", Proc. International Society for Magnetic Resonance in Medicine, vol. 17, Jan. 2009, p. 4522.

Hernando, D. et al "Joint Estimation of Water/Fat Images and Field Inhomogeneity Map", Magnetic Resonance in Medicine, vol. 59, No. 3, Mar. 2008, pp. 571-580.

Siero, J.C. et al "Cost Function Guided Image Based Bo Shimming at 3T for Efficient Fat Suppression in Liver and Prostate Imaging", Joint Annual Meeting ISMRM-ESMRMB, International Society for Magnetic Resonance in Medicine, May 2010, pp. 2589.

Jacob, Mathews et l "Algebraic Decomposition of Fat and Water in MRI", IEEE Transactions on Medical Imaging, vol. 28, No. 2, Feb. 2009, pp. 173-184.

Kullberg, Joel et al "Automated Assessment of Whole-Body Adipose Tisssue Depots from Continuously Moving Bed MRI: A Feasibility Study", Journal of Magnetic Resonance Imaging, vol. 30, 2009, pp. 185-193.

Palosaari, Kari et al "Post-Processing Water-Fat Imaging Technique for Fat Suppression in a Low-Field MR Imaging System, Evaluation in Patients with Rheumatoid Arthritis", Magnetic Resonance Materials in Physics, Biology and Medicine, vol. 15, 2002, pp. 1-9.

Yu, Huanzhou et al "Single Acquisition Water-Fat Separation: Feasibility Study for Dynamic Imaging", Magnetic Resonance in Medicine, vol. 55, 2006, pp. 413-422.

* cited by examiner

MR IMAGING USING A MULTI-POINT DIXON TECHNIQUE

CROSS-REFERENCE TO PRIOR APPLICATIONS

This application is the U.S. National Phase application under 35 U.S.C. §371 of International Application No. PCT/IB2011/055336, filed on Nov. 28, 2011, which claims the benefit of European Patent Application No. 10193467.7, filed on Dec. 2, 2010 and European Patent Application No. 11159548.4, filed on Mar. 24, 2011. These applications are hereby incorporated by reference herein.

TECHNICAL FIELD

The invention relates to the field of magnetic resonance (MR) imaging. It concerns a method of MR imaging of at least a portion of a body of a patient positioned in an examination volume of an MR device. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field $B_0$ extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

With increasing field strength, the off-resonance effects caused by $B_0$ inhomogeneities become more severe and affect all MR applications. Conventional $B_0$ shimming methods focus either on a local volume or on a global volume of $B_0$ inhomogeneities. However, there are MR applications which demand globally constrained $B_0$ offsets, for example for frequency-selective fat suppression, throughout the field of view (FOV), but also require locally optimal $B_0$ homogeneity in a region of interest (ROI). An optimal shimming solution for a specific MR application can be achieved by exploiting the higher order shimming coils available in high field MR systems. J. C. Siero et al. (ISMRM $16^{th}$ Scientific Meeting 2010 Proceedings, p. 2589) have proposed a cost function guided shimming approach that is used at a $B_0$ field of 3 Tesla for efficient fat suppression in liver and prostate. According to this approach, a trade-off is sought between global and local field homogeneity for the purpose of finding a balance between effective fat suppression and local geometrical distortions. A drawback of this known approach is that no analysis of the target anatomy with regard to the distribution of fat tissue is performed. The known approach differentiates only between the local region of interest and the remaining global field of view. For this reason, no optimal $B_0$ homogeneity is achieved in the regions containing fat tissue in all cases.

In the paper 'Single acquisition water-fat separation: feasiblity study for dynamic imaging' by H. Yu et al. in MRM 55 (2006)413-422 a three-point water-fat separation is mentioned in which a coil sensitivity calibration scan is integrated with undersampled dynamic acquisitions. The coil sensitivity calibration scan is acquired with full-FOV which enables unwrapping of the dynamic acquisitions.

SUMMARY OF THE INVENTION

From the foregoing it is readily appreciated that there is a need for an improved MR imaging technique. It is consequently an object of the invention to provide a method that enables to increase image quality, notably by achieving a better fat suppression.

In accordance with the invention, a method of MR imaging of at least a portion of a body of a patient positioned in an examination volume of a MR device is disclosed. The method comprises the steps of:
 subjecting the portion of the body to a calibration sequence comprising RF pulses and switched magnetic field gradients controlled in such a manner that a calibration signal data set is acquired by means of a multi-point Dixon technique at a first image resolution;

segmenting water segment and a fat segment from the calibration signal data set deriving calibration parameters for each of the water segment and the fat segment;

subjecting the portion of the body to an imaging sequence comprising RF pulses and switched magnetic field gradients controlled in such a manner that a diagnostic signal data set is acquired at a second image resolution which is higher than the first image resolution; and reconstructing a diagnostic MR image from the diagnostic signal data set, wherein the MR device (1) is operated according to the derived calibration parameters during acquisition of the diagnostic signal data set and/or during reconstruction of the diagnostic MR image.

According to the per se known multi-point Dixon technique, the spectral difference between fat and water spins are made use of for the purpose of separating MR signals emanating from water containing tissue and MR signals emanating from fat tissue. In multi-point Dixon, multiple acquisitions of k-space are repeated with different echo times. The simplest Dixon technique, 2-point Dixon, acquires two complete k-space data sets, wherein the fat magnetization in the second acquisition is out of phase relative to the first acquisition at the respective echo times. Separate and distinct water and fat images are obtained by simple addition or a subtraction of the complex MR signal data sets. However, the original 2-point Dixon technique fails, when $B_0$ field inhomogeneities become larger. This is the case for many clinical applications at high $B_0$ fields where global shimming algorithms cannot completely compensate for local field variations. Higher order Dixon techniques such as 3-point Dixon or 4-point Dixon were developed to correct for these field inhomogeneities. In general, a $B_0$ field map, a water image and a fat image is obtained by means of a multi-point Dixon sequence.

According to the invention, a multi-point Dixon sequence is applied during a low-resolution calibration scan prior to the acquisition of the actual diagnostic image. The advantage is that $B_0$ mapping using multi-point Dixon is very fast and provides useful information regarding the water and fat distribution within the field of view in addition to the $B_0$ map that can be exploited for example for deriving shim settings as calibration parameters. Notably, the calibration parameters are optimised independently for each water and fat segment in the calibration data set.

A low-resolution MR image, i.e. an image that is acquired at the first image resolution within the meaning of the invention, is an image, which is, due to the large voxel volume of 10-1000 mm$^3$, not usable for diagnostic purposes. A high-resolution MR image, i.e. a MR image that is acquired at the second image resolution within the meaning of the present invention, is used to answer the respective diagnostic question. The voxel volume of the diagnostic MR image is 10 mm$^3$ or less. Because of the difference in voxel volume, the calibration signal data set can be acquired much faster than the diagnostic signal data set.

According to a preferred embodiment of the invention, the imaging sequence comprises one or more fat suppression RF pulses effecting a spectrally selective suppression of fat signals in the diagnostic signal data set. Since a $B_0$ map is obtained from the calibration signal data acquired by means of a multi-point Dixon technique in accordance with the invention, the correct frequency and/or bandwidth of the one or more spectrally selective fat suppression RF pulses can be estimated as calibration parameters in a straight forward manner. In the case of image based shimming, a simulated $B_0$ map (i.e. the $B_0$ map obtained from the calibration signal data corrected according to the used shim settings) can advantageously be the basis for estimating the frequency and/or bandwidth of the one or more fat suppression RF pulses. The frequency and/or bandwidth of the fat suppression can be determined in such a manner that the number of pixels or voxels within a given region of interest having a $B_0$ outside the range of spectral selectivity of the one or more fat suppression RF pulses is minimized. In this way, an optimum frequency and bandwidth of the fat suppression can be achieved.

Moreover, the simulated $B_0$ map can also be used to minimize the amount of undesired water suppression effected by the fat suppression RF pulses due to $B_0$ inhomogeneity by appropriate selection of the frequency and/or bandwidth of the fat suppression RF pulses. For example, a weighted cost function computed from the number of fat pixels or voxels and from the number of water pixels or voxels affected by the fat suppression RF pulses can be optimized in order maximize image quality. In case water and fat segments are derived from the calibration signal data, the knowledge about the spatial distribution can be taken into account as well for determining the parameters of the fat suppression RF pulses. For example, pixels or voxels that are located within a fat segment can be weighted different than pixels or voxels that are located within a water segment in order to achieve an optimum result.

In multi-slice imaging, the described calibration procedure should be repeated for each slice.

In many applications fat suppression turns out to be difficult, especially in large imaging volumes. This results in regions in the reconstructed MR images having a high image intensity due to failing fat suppression. Fat suppression often fails because the $B_0$ field is not sufficiently homogeneous to affect all fat spins by the respective frequency selective fat suppression RF pulses. Since a $B_0$ map, a water map, and a fat map can be obtained from the calibration signal data acquired by means of a multi-point Dixon technique in accordance with the invention, a prediction of pixels or voxels of the diagnostic MR image, in which the spectrally selective suppression of fat signals is incomplete or fails, can be derived. This can be achieved by simply comparing the frequency and bandwidth of the fat suppression RF pulses with the $B_0$ at the location of a given pixel or voxel. Because the fat and water contribution to the individual pixels or voxels of the diagnostic MR image are known from the fat and water maps, pixels or voxels, for which an incomplete or entirely failing fat suppression is predicted, can be corrected in a post-processing step in order to eliminate the signal contribution from fat. An unwanted suppression of water signals can be processed and corrected for in an analogous manner. A considerable increase of image quality can be achieved in this way by mere post-processing of the reconstructed diagnostic MR image.

According to yet a further preferred embodiment, the method of the invention comprises the steps of:

reconstructing at least one water image and at least one fat image from the calibration signal data set;

identifying a water region and a fat region on the basis of the at least one water image and the at least one fat image; and determining shim settings that maximize the $B_0$ homogeneity in the water region and/or in the fat region.

Since the calibration signal data set is acquired in accordance with the invention by means of a multi-point Dixon technique, a water map, a fat map and a $B_0$ map can be reconstructed from the calibration data, as already mentioned above. These maps are then used for a (preferably automated) segmentation of the water image and the fat image in order to obtain a water region and a fat region. The water region and the fat region are regions within the field of view that contain mainly water and fat tissue respectively. On this basis it is possible to determine shim settings that maximize the $B_0$ homogeneity (i.e. minimize the $B_0$ deviations) either in the water region or in the fat region. It is also possible to determine the shim settings in such a manner that a compromise is found that provides a decent $B_0$ homogeneity in both the water region and the fat region.

According to yet another preferred embodiment of the method of the invention, the shim settings are computed by optimizing a cost function depending on the $B_0$ deviation within the water region and the fat region. A minimization algorithm can be used to minimize an appropriately set up cost function. Therein the algorithm minimizes the deviation of $B_0$ in the water region, while simultaneously minimizing the number of voxels within the fat region which deviate more than a given offset value, for example 160 Hz, from the MR resonance frequency. A weighting factor can be applied for differently weighting the water region and the fat region in the cost function. The weighting factor can be selected such that the fat signal within the fat region is sufficiently well suppressed in the final diagnostic image (which is acquired by using frequency selective fat saturation), while the $B_0$ homogeneity within the water region is sufficiently homogeneous for delivering a diagnostic image of good quality. The parameters resulting from the minimization algorithm can then directly be translated into shim settings for energizing the shimming coils of the MR device.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, a reconstruction unit, and a visualization unit. The method of the invention is implemented by a corresponding programming of the reconstruction unit, the visualization unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
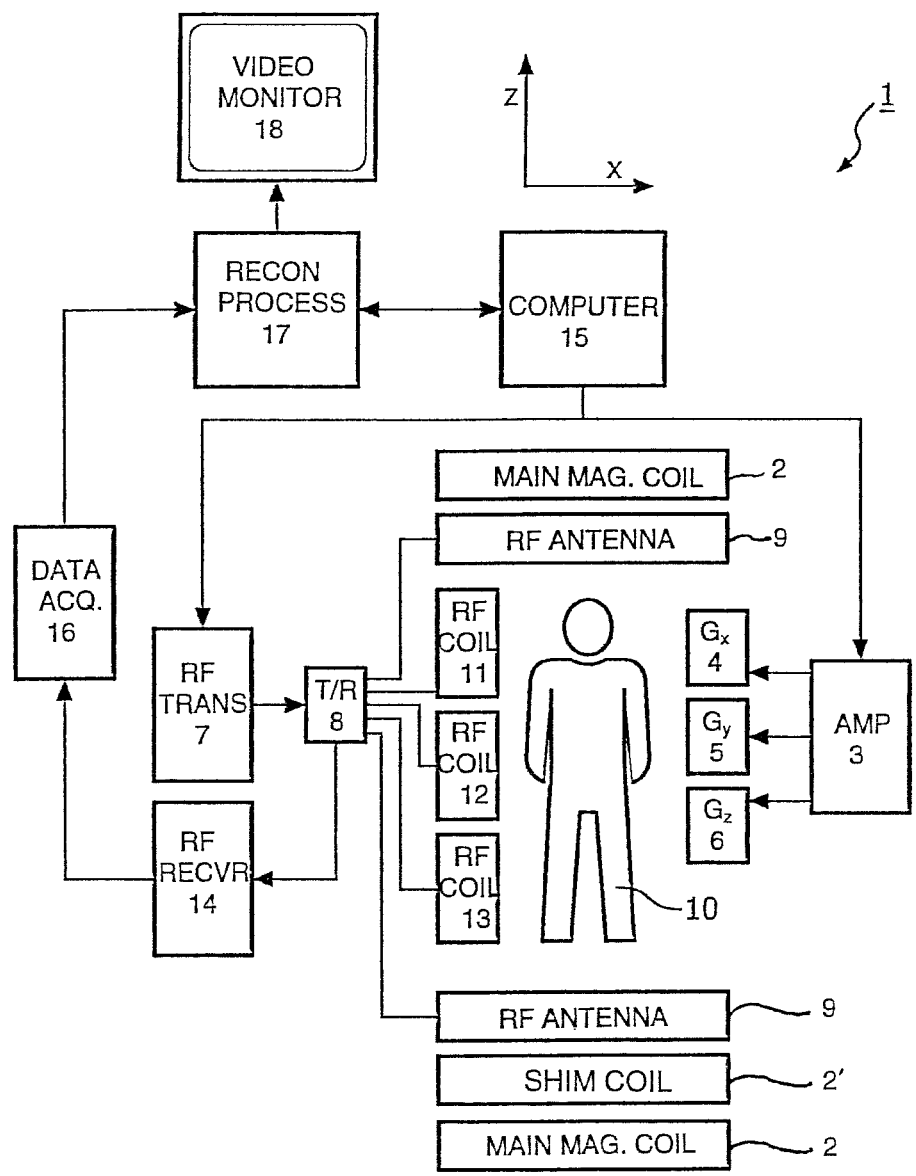
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send—/receive switch 8, to a —body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

A first practical embodiment of the method of the invention is described as follows:

After positioning the patient 10 in the iso-centre of the main magnet coil 2, a calibration sequence is started as a three-dimensional SENSE reference scan. The calibration scan uses several signal averages performed sequentially in time and is designed in the conventional way with interleaving signal acquisition via the body RF coil 9 and the array RF coils 11, 12, 13 using a Fast Field Echo (FFE) sequence. This sequence is modified into a multi-echo gradient echo sequence generating two or three gradient echoes after one excitation RF pulse, thereby facilitating chemical shift encoding. The calibration sequence is applied at a low image resolution such that the whole calibration scan can be performed within a couple of seconds.

Figure 2:
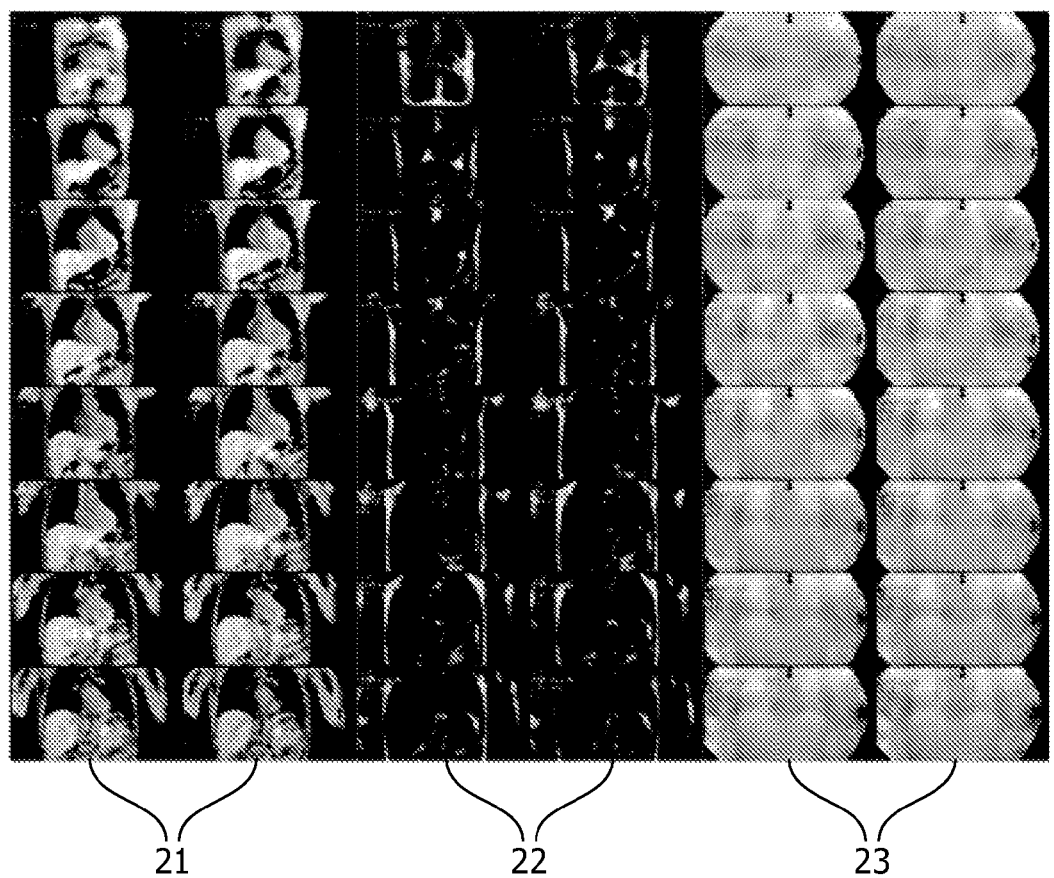
FIG. 2 shows low-resolution MR images reconstructed from calibration signal data according to the invention.

The acquired calibration signal data are then reconstructed corresponding low-resolution images involving a water/fat separation step according to the per se known multi-point Dixon technique. The resulting images are shown in FIG. 2. FIG. 2 shows the images reconstructed after the water/fat resolved SENSE calibration scan according to the invention. The reconstructed calibration images include water images 21, fat images 22, and $B_0$ maps 23. Only a subset of the complete calibration data is shown in FIG. 2. In the practical embodiment, 64 slices are acquired with a voxel volume of $8\times 8\times 12$ mm$^3$. A 3-point Dixon technique is applied. The repetition time is 3.5 ms. The low-resolution images reconstructed from the calibration signal data set are transferred to image processing while the acquisition of the next three-dimensional block of calibration signal data is acquired to improve the signal-to-noise ratio or to acquire a different motion state.

Shim settings are derived from the $B_0$ maps 23, which are used for controlling currents through the shimming coils 2' of the MR device 1 in order to optimize $B_0$ homogeneity.

After the calibration sequence, an imaging sequence is applied at higher resolution, wherein diagnostic signal data are acquired in parallel via the array RF coils 11, 12, 13. The imaging sequence comprises one or more fat suppression RF pulses effecting a spectrally selective suppression of fat signals in the diagnostic signal data set. For example, a per se known SPAIR technique (spectrally adiabatic inversion recovery) is used for fat suppression. The $B_0$ maps 23 are used for determining the correct frequency and/or bandwidth of the fat suppression RF pulses. To this end, simulated $B_0$ maps (i.e. $B_0$ maps 23 corrected according to the used shim settings) reflecting the 'true' $B_0$ within the examination volume are computed as a basis for estimating the frequency and bandwidth of the fat suppression RF pulses. The frequency and bandwidth of the fat suppression RF pulses are determined in such a manner that the number of voxels having a $B_0$ outside the range of spectral selectivity of the fat suppression RF pulses is minimized.

Finally, a diagnostic MR image (not depicted) is reconstructed from the acquired diagnostic signal data set by the reconstruction processor 17 which applies the per se known SENSE reconstruction algorithm.

Figure 3:
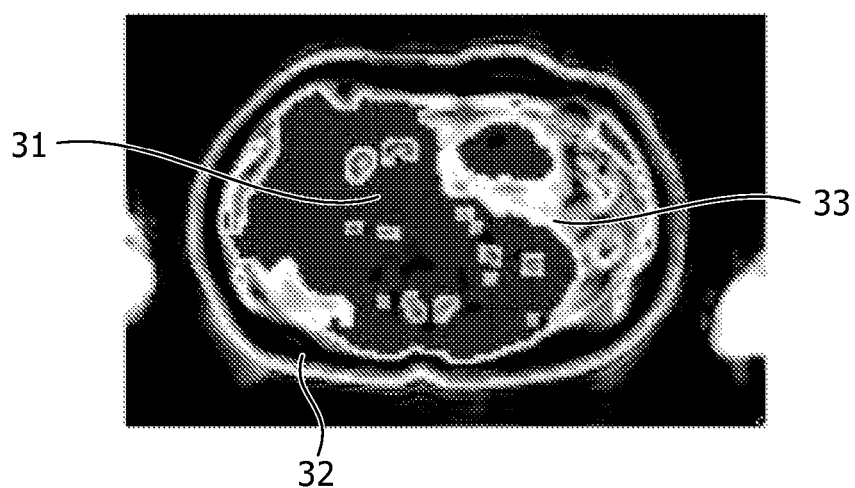
FIG. 3 shows water and fat regions in a MR image reconstructed from calibration signal data according to the invention.

According to yet another practical embodiment of the invention, again a $B_0$ map, a water image and a fat image is acquired by means of the calibration sequence at a low image resolution. An automated segmentation is then performed in order to identify regions containing water, regions containing fat tissue and regions containing both water and fat on the basis of the $B_0$ map, the water map, and the fat map as delivered by the multi-point Dixon technique. FIG. 3 shows the result of the segmentation. The water region is designated by reference number 31. The segment 32 represents subcutaneous fat. The region 33 represents a region containing a combination of water and internal fat. On the basis of this segmentation, the shim settings for the shimming coils 2' of the used MR device 1 are computed by optimizing a cost function depending on the $B_0$ deviation within the regions 31 and 32. It is postulated that in order for the "fat segment" 32 to be suppressed optimally by means of frequency-selective saturation, the number of voxels in the segment 32 with a frequency offset larger than 160 Hz needs to be minimized. It has to be noted that this is an asymmetric criterion since large negative frequency offsets are not relevant. For the "water segment" 31, it is assumed that shimming is sufficient if the number of pixels outside of a frequency offset interval of +−120 Hz is minimized. Both criteria are summed in order to form the cost function. The cost function is minimized by means of an appropriate algorithm. The resulting parameters are then used to derive the shim settings accordingly.

Since a $B_0$ map, a water map, and a fat map are obtained from the calibration signal data, a prediction of voxels of the diagnostic MR image, in which the fat suppression of fat signals will be incomplete or even fails totally, are derived in accordance with an embodiment of the invention. This is achieved by comparing the frequency and bandwidth of the fat suppression RF pulses with the $B_0$ at the location of a given voxel. If the local $B_0$ field is lower or higher than the spectral coverage of the fat suppression RF pulses, fat suppression will fail for the respective voxel. Since the fat and water contribution to the individual voxels are known from the fat and water maps, voxels for which an incomplete or entirely failing fat suppression is predicted are corrected in the final diagnostic MR image in a post-processing step in order to eliminate the signal contribution from fat. To this end, the signal contribution from fat in the respective voxel is derived from the fat map, and the image intensity of the voxel is reduced proportionally. The spectral profile of the fat suppression RF pulses can be taken into account in order to estimate an analogous value reflecting how much the fat suppression will fail for the respective voxel. This value can then be used as a correction factor in order eliminate the fat contribution as precisely as possible. An unwanted suppression of water signal can be processed and corrected for in an analogous fashion. A considerable increase of image quality is achieved in this way by mere post-processing of the reconstructed diagnostic MR image.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of MR imaging of at least a portion of a body of a patient positioned in an examination volume of a MR device, the method comprising:

with an MR controller, controlling at least one RF coil and
  gradient field coils in order to implement a multi-point
  Dixon imaging technique that generates calibration MR
  data for the portion of the body in the examination
  volume at a first image resolution;
with one or more computer processors:
  reconstructing the calibration MR data into a $B_0$ field
    map, a water map, and a fat map,
  identifying fat and water regions of the portion of the
    body in the image volume from the water and fat
    maps, and
  selecting a frequency and bandwidth for each of a
    plurality of fat suppression pulses,
with the MR controller, controlling the at least one RF coil
  and the gradient field coils that generate RF pulses
  including the plurality of fat suppression pulses and the
  switched magnetic field gradients in order to generate
  diagnostic image data at a second image resolution
  which is higher than the first image resolution;
with the one or more processors:
  reconstructing a diagnostic MR image from the generated diagnostic image data at the second image resolution which is higher than the first image resolution, and
  having the one or more processors, identify pixels or voxels of the reconstructed diagnostic MR image in which the fat suppression is incomplete or has failed, by using the reconstructed $B_0$ field map and the reconstructed fat map along with the frequency and bandwidth of the plurality of fat suppression pulses.

2. The method of claim 1, wherein fat suppression RF pulses effect a spectrally selective suppression of fat signals in the diagnostic image data.

3. The method of claim 2, further including with the one or more computer processors, determining shim settings from the $B_0$ field map and at least one of the water and fat maps in order to control a plurality of shim coils and thereby improve linearity of the existing $B_0$ field occurring in at least one of water and fat regions within the portion of the body that is in the examination volume.

4. The method of claim 3, wherein the frequency and bandwidth of the one or more fat suppression RF pulses is determined from the improved linearity of the B0 field whereby a number of pixels or voxels within a given region of interest having a $B_0$ field strength outside of a predetermined range of spectral selectivity, of the one or more fat suppression RF pulses is minimized.

5. The method of claim 2, wherein one or more computer processors generates a prediction derived from the calibration MR data about the pixels or voxels within the reconstructed diagnostic MR image, in which the spectrally selective suppression of fat signals is incomplete or has failed.

6. The method of claim 5, wherein the diagnostic MR image is corrected in a post-processing according to the prediction by regenerating the calibration MR data using a higher order multi-point Dixon imaging technique.

7. The method of claim 1, further comprising:
  determining shim settings that maximize magnetic field homogeneity in the water region and/or in the fat region.

8. The method of claim 7, wherein the shim settings are computed with the one or more processors by optimizing a cost function depending on the $B_0$ field deviation within the water region and the fat region.

9. A magnetic resonance (MR) device that images at least a portion of a body of a patient positioned in an examination volume comprising:
  at least one main magnet coil configured to generate a uniform, steady magnetic field $B_0$ within an examination volume;
  a number of gradient coils configured to generate switched magnetic field gradients in different spatial directions within the examination volume;
  at least one body RF coil configured to generate RF pulses within the examination volume and/or configured for receiving MR signals from a portion of a body of a patient positioned in the examination volume;
  shimming coils configured to adjust the homogeneity of the a steady magnetic field $B_0$;
  a MR controller configured to control the at least one RF body coil and the number of gradient coils in order to generate the temporal succession of RF pulses and switched magnetic field gradients which then subject the portion of the body of the patient positioned in the examination volume to a multi-point Dixon imaging technique in order to generate calibration data at a first image resolution;
  one or more computer processors configured to:
    segment the generated calibration data into a water region and a fat region
    select $B_0$ shim settings that maximize B0 homogeneity in each of the water region and the fat region,
    cause the MR controller to subject the portion of the body to a multi-point Dixon magnetic resonance imaging sequence comprising RF pulses and switched magnetic field gradients controlled in such a manner that diagnostic MR image data is acquired at a second image resolution which is higher than the first image resolution, and
    reconstruct a diagnostic MR image from the diagnostic MR image data, wherein the MR device is operated according to the derived calibration parameters during acquisition of the diagnostic MR data and/or during reconstruction of the diagnostic MR image.

10. A non-transitory computer-readable medium carrying software to control one or more computer processors in order to control a MR device and perform the method of claim 1.

11. A magnetic resonance (MR) imaging apparatus configured for imaging a portion of a body in an examination volume, the MR imaging apparatus comprising:
  at least one main magnet coil configured to generate a uniform, steady $B_0$ magnetic field within the examination volume;
  gradient coils configured to generate magnetic field gradients within the examination volume;
  RF coil windings configured to generate RF pulses within the examination volume and receive MR signals from the portion of the body positioned in the examination volume;
  shim coils configured to shim the $B_0$ magnetic field;
  one or more computer processors configured to:
    control the RF coil windings and the gradient coils in order to implement a multi-point Dixon imaging sequence and generate calibration data at a first image resolution,
    reconstruct, from the generated calibration data, a $B_0$ field map, a water image, and a fat image at the first image resolution, identify water and fat regions within the portion of the body that is in the examination volume from the reconstructed water and fat images, determine a $B_0$ magnetic field homogeneity in each of the water regions and in each of the fat regions, determine settings for each of the shim coils in order to adjust the $B_0$ magnetic field homogeneity that is present in the water and fat regions, select a frequency and a bandwidth of one or more fat suppression RF pulses, based on the adjusted $B_0$ magnetic field homogeneity, the reconstructed water image, and the reconstructed fat image, whereby a number of pixels or voxels, located within a given region of interest of the portion of the body in the examination region, that have a $B_0$ magnetic field homogeneity outside of a pre-determined range of spectral selectivity, of the one or more fat suppression RF pulses, is minimized, control the gradient coils, the RF coil windings, and the shim coils in order to shim the $B_0$ magnetic field and adjust the $B_0$ magnetic field homogeneity and apply a magnetic resonance imaging sequence that uses the one or more fat suppression pulses of the selected frequency and bandwidth in order to generate diagnostic MR image data at a second image resolution, the second image resolution being higher than the first image resolution, and reconstruct the diagnostic MR image data into a diagnostic MR image.

12. The MR imaging apparatus of claim 11, wherein the one or more computer processors are further configured to adjust the $B_0$ magnetic field homogeneity such that the linearity of the $B_0$ magnetic field in at least one of the water and fat regions is optimized.

13. The MR imaging apparatus of claim 11, wherein the one or more processors are further configured to:

Identify pixels or voxels in the reconstructed diagnostic MR image in which fat suppression is projected to be incomplete or fail, by comparing a frequency, and/or bandwidth of the $B_0$ fat saturation RF pulses with the $B_0$ homogeneity at each pixel or voxel; and perform a post-processing on at least the identified pixels or voxels in order to compensate for signal contribution from the fat saturation RF pulses.

14. The MR imaging apparatus of claim 13, wherein the post-processing on at least the identified pixels or voxels further includes: using the $B_0$ field map in order to minimize any undesired suppression of water signals of at least those identified pixels or voxels.

15. The MR imaging apparatus of claim 11, wherein the one or more computer processors are further configured to:

determine the pixels or voxels in which the suppression of the fat signals is incomplete or fails by comparing the frequency and the bandwidth of the fat suppression RF pulses with the adjusted $B_0$ magnetic field at the pixels or voxels being analyzed.

16. The MR imaging apparatus according to claim 11, wherein the multi-point Dixon imaging sequence is one of a three-point or a four-point Dixon imaging technique.

* * * * *